United States Patent [19]

Nakhla

[11] 4,443,662
[45] Apr. 17, 1984

[54] FILTERS COMPRISING REACTIVE COMPONENTS, AND A METHOD OF DETERMINING IMPEDANCES THEREOF

[75] Inventor: Michael S. Nakhla, Ottawa, Canada

[73] Assignee: Northern Telecom Limited, Montreal, Canada

[21] Appl. No.: 333,665

[22] Filed: Dec. 23, 1981

Related U.S. Application Data

[63] Continuation-in-part of Ser. No. 252,925, Apr. 10, 1981, abandoned.

[51] Int. Cl.³ .................... H04M 11/00; H03H 5/00
[52] U.S. Cl. .................. 179/2 C; 179/2 DP; 333/32
[58] Field of Search .......... 179/16 F, 170 D, 18 AH, 179/2 C, 2 DP; 333/32, 167, 168, 33, 34, 35

[56] References Cited

U.S. PATENT DOCUMENTS 1,752,461  4/1930  Shea ................................. 333/168
3,132,313  5/1964  Alford ............................... 333/32
3,987,375  10/1976  May et al. ..................... 333/32 X

OTHER PUBLICATIONS

*Electrical Communication*, vol. 36, No. 1, 1959, pp. 3–26, "Gaussian Response Filter Design", Dishal.
*IRE Transactions on Circuit Theory*, pp. 284–327, Dec. 1958, "On The Design of Filters by Synthesis", Saal and Ulbrich.
"FILSYN–A General Purpose Filter Synthesis Program" by G. Szentirmai, Proc. IEEE, vol. 65, No. 10, Oct. 1977, pp. 1443 to 1458.
"SCAMPER"–Telesis, vol. 7, No. 3, 1980, pp. 2 to 9.

*Primary Examiner*—Harold I. Pitts
*Assistant Examiner*—W. J. Brady
*Attorney, Agent, or Firm*—R. John Haley

[57] ABSTRACT

A filter comprising reactive components which define pass and stop bands has the impedances of the components selected to minimize the sum $|Zin-Z2|+|Zout-Z1|$ in the pass band, where Zin and Zout are respectively the input and output impedances of the filter and Z1 and Z2 are nominal termination impedance at respectively the input and output of the filter. The filter characteristic in the pass band is thereby made substantially independent of the actual termination impedances of the filter in use. The design is exemplified by a 5th order low pass filter for connection in the voice signal path of a telephone subscriber line.

9 Claims, 9 Drawing Figures

FILTERS COMPRISING REACTIVE COMPONENTS, AND A METHOD OF DETERMINING IMPEDANCES THEREOF

This is a continuation-in-part of application Ser. No. 252,925 filed April 10, 1981 abandoned.

Reference is also directed to our applications Ser. Nos. 333,664 and 333,666 filed simultaneously herewith by R.T. Carsten et al both entitled "Apparatus for coupling signals to or from a two-wire line", the entire disclosures of which are hereby incorporated herein by reference.

This invention relates to filters comprising reactive components, and to a method of determining impedances of such components. The invention is particularly, but not exclusively, concerned with low pass filters for connection to telephone subscriber lines for passing voice frequency signals on such lines.

Prior art filters have been designed to provide a desired attenuation-frequency characteristic when terminated with predetermined source and load impedances. Although known design procedures result in filters which perform in accordance with their design characteristics when properly terminated with the predetermined impedances, the design characteristics generally will not be satisfied if the termination impedances differ or vary from the predetermined values.

Thus the design of a filter for use with variable termination impedances presents a problem. This problem is particularly significant if the terminations of the filter may have widely variable impedances, such as is the case for a filter to be connected to a telephone subscriber line. Such lines have a nominal resistive impedance of typically 600 ohms, but in fact individual subscriber lines may have a complex impedance which is substantially different from this. Accordingly, a filter designed for termination with resistive impedances of 600 ohms, when connected to an actual subscriber line of different impedance, will not necessarily satisfy its design characteristics.

In order to overcome this problem, the actual impedance of an individual subscriber line can be measured or otherwise determined and a filter can be designed specifically for this line impedance. This is obviously time consuming and inconvenient, and the resulting filter is not usable on arbitrary subscriber lines. Alternatively, buffers can be provided so that the filter can be terminated with the nominal impedances for which it is designed. Because the subscriber line must transmit signals in both directions, this necessitates the use of 2-wire/4-wire hybrid circuits and separate filters and buffers for the two transmission directions, resulting in increased cost and complexity. As a further alternative, adaptive filters can be used, again with the disadvantages of increased cost and complexity.

Accordingly, a need exists to provide a simpler form of filtering arrangement which can satisfy its design characteristics when terminated with various impedances. A particular need exists for filters which can be used with arbitrary telephone subscriber lines, especially for separating voice frequency signals and above voice-band data signals on such lines, without resorting to buffering or adaptive arrangements.

An object of this invention is to provide a filter, and a method of determining impedances of reactive components of a filter, which enable these needs to be fulfilled.

According to one aspect this invention provides a filter comprising reactive components which define a pass band and a stop band of the filter, said filter having an input port of input impedance $Z_{in}$ for termination with a source impedance $Z_1$, and having an output port of output impedance $Z_{out}$ for termination with a load impedance $Z_2$, wherein the impedances of said reactive components are selected to minimize the quantities $|Z_{in}-Z_2|$ and $|Z_{out}-Z_1|$ in said pass band.

Conveniently the impedances of said reactive components are selected to minimize the sum $|Z_{in}-Z_2|+|Z_{out}-Z_1|$ in said pass band.

In a preferred embodiment of the invention described below, the filter is a low pass filter for connection to a telephone subscriber line for passing voice frequency signals on said subscriber line. In this embodiment the filter is a 5th order filter wherein, for nominal source and load impedances $Z_1$ and $Z_2$ of 600 ohms, said reactive components comprise in turn a shunt capacitance of about 30.88 nF, a series inductance of about 24.96 mH, a shunt capacitance of about 80.54 nF in series with an inductance of about 0.399 mH, a series inductance of about 24.96 mH, and a shunt capacitance of about 30.88 nF. The filter may be balanced by dividing each of the series inductances substantially equally between the two wires of the filter.

The invention also extends to the combination of a low pass filter having an input port and an output port, telephone equipment of nominal impedance $Z_1$ coupled to the input port of the filter, and a telephone subscriber line of nominal impedance $Z_2$ coupled to the output port of the filter, wherein the filter comprises reactive components which define a pass band for voice frequency signals and a stop band for higher frequencies, and wherein the impedances of said reactive components are selected to minimize the sum $|Z_{in}-Z_2|+|Z_{out}-Z_1|$ in said pass band, where $Z_{in}$ and $Z_{out}$ are respectively the input and output impedances of the filter, whereby the attenuation of the filter throughout said pass band is substantially constant regardless of the actual impedance of the telephone subscriber line.

According to another aspect, the invention provides a method of determining impedances of reactive components of a filter, having characteristics including a pass band with a predetermined maximum attenuation variation and a stop band with a predetermined minimum attenuation, for termination with a nominal source impedance $Z_1$ and a nominal load impedance $Z_2$, said method comprising determining said impedances to provide said characteristics and to minimize the quantities $|Z_{in}-Z_2|$ and $|Z_{out}-Z_1|$ in said passband, where $Z_{in}$ and $Z_{out}$ are respectively the input and output impedances of the filter, thereby minimizing variations in the transfer function of the filter in the passband when the source and load impedances vary from their nominal values.

As is explained below, the design of filters in accordance with the invention renders them substantially independent of the impedances with which they are terminated so that the filter design characteristics are satisfied with various termination impedances without any buffering of the filters and without requiring the filters to be individually adjusted or to be of an adaptive type. In consequence, the filters as described below are relatively simple and bidirectional so that they can be used conveniently, particularly on telephone subscriber lines.

The invention will be further understood from the following description with reference to the accompanying drawings, in which.

Figure 5:
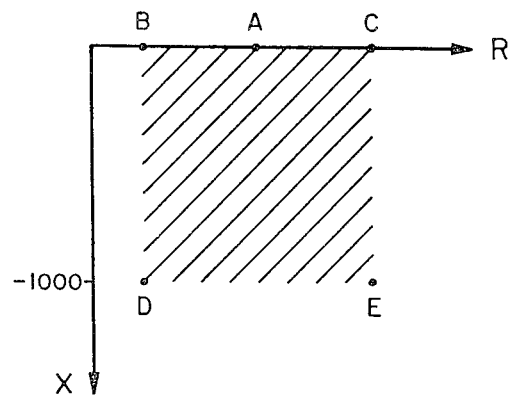
Figure 6:
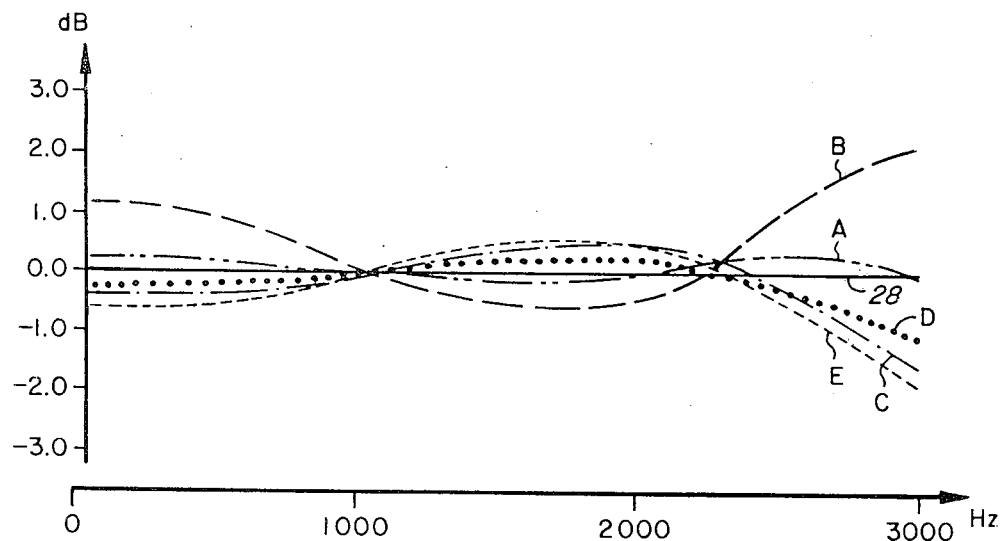
Figure 7:
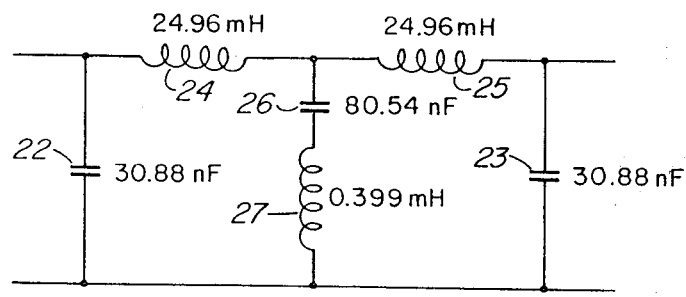
Figure 8:
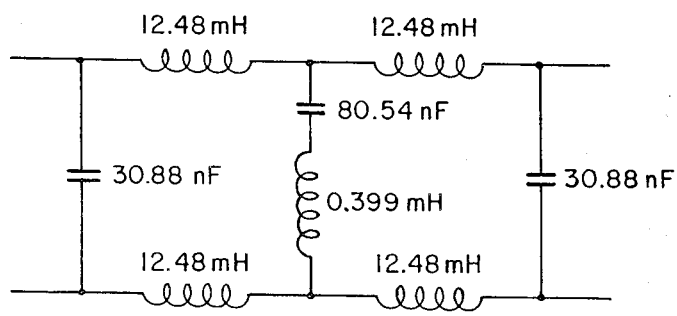
Figure 9:
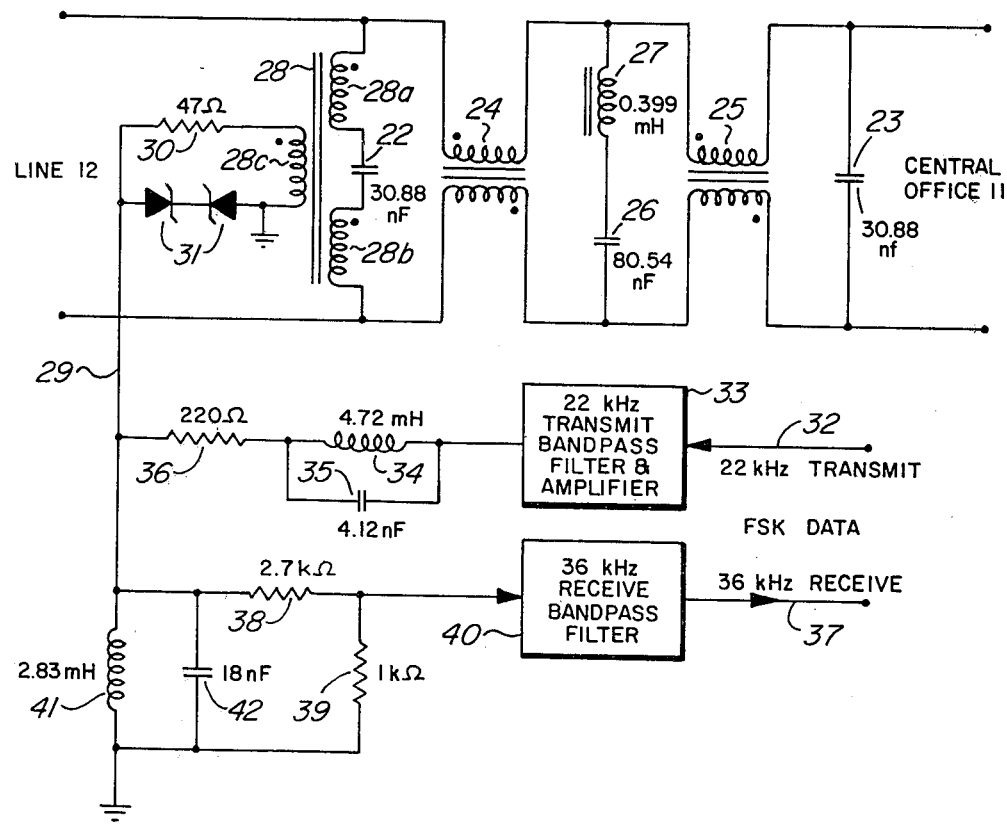

FIG. 5 is a graph, and FIG. 6 is an illustration of filter responses in the pass band, with reference to which the disadvantages of the prior art low pass filter and the advantages of a low pass filter according to this invention are explained; and FIGS. 7 and 8 illustrate two alternative forms of a low pass filter according to this invention; and FIG. 9 illustrates a modified form of the low pass filter of FIG. 8, also illustrating the form of a coupling network for coupling data signals to and from the telephone subscriber line.

Figure 1:
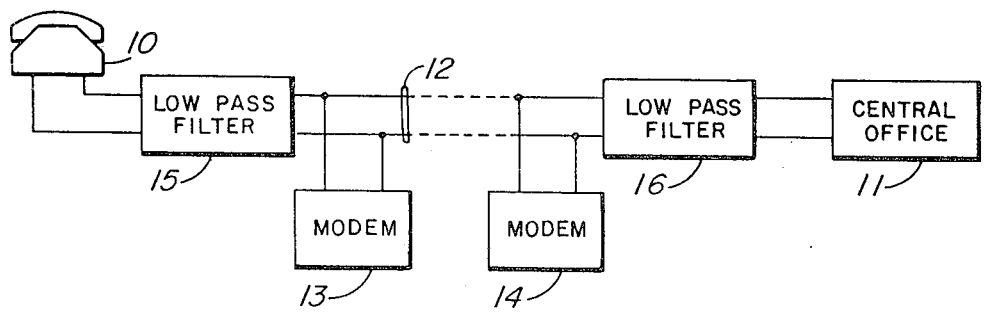
FIG. 1 illustrates in a block diagram a telephone subscriber line including at each end of the line a low pass filter for separating voice frequency signals from higher frequency data signals on the line.

Referring to FIG. 1, a subscriber's telephone 10 is coupled to a telephone central office 11 via a conventional two-wire subscriber line 12. Modems 13 and 14 are also connected to the subscriber line 12 for transmitting data via the subscriber line between the locations of the telephone 10 and the central office 11, at a frequency, of for example 21 kHz, which is above the voice frequency band. In order to prevent the data from passing to the telephone 10 and to the central office 11, these are coupled to the subscriber line 12 via low pass filters 15 and 16.

Figure 2:
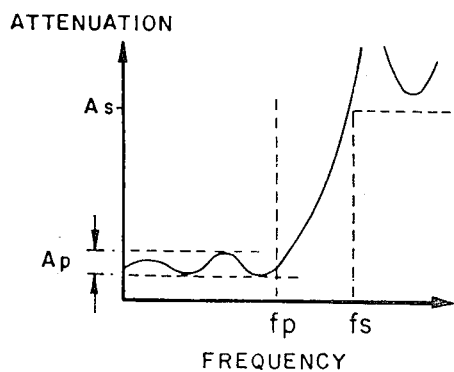
FIG. 2 illustrates an attenuation versus frequency characteristic of the low pass filter.

FIG. 2 illustrates the attenuation of a low pass filter as a function of frequency. Each of the filters 15 and 16 is required to have a characteristic including a pass band up to a frequency fp in which the filter has a maximum attenuation ripple, or variation, Ap, and a stop band from a frequency fs in which the filter has a minimum attenuation As. Typically fs=21 kHz, As=60 dB, fp=3200 Hz, and Ap=±0.1 dB relative to the attenuation at 1000 Hz.

Figure 3:
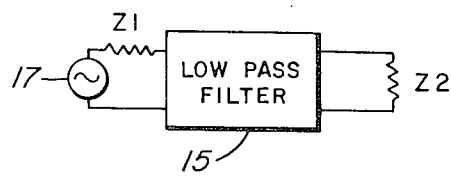
FIG. 3 is an equivalent circuit of the connections of the low pass filter.

As shown by the equivalent circuit of FIG. 3, for example the low pass filter 15 is effectively driven by a voltage source 17 in series with an impedance Z1 connected to an input port of the filter, and is loaded by an impedance Z2. The source 17 and impedance Z1 correspond to the telephone 10, while the impedance Z2 corresponds to the subscriber line 12, both typically having nominal impedances of 600 ohms.

In order to determine a suitable form for each of the low pass filters, in the prior art the desired characteristic values fs, As, fp, and Ap have been used to design a filter to be terminated by resistive impedances Z1 and Z2. This design is particularly conveniently carried out using the computer design program FILSYN (see "FILSYN—A General Purpose Filter Synthesis Program", by G. Szentirmai, Proc. IEEE, Vol. 65, No. 10, October 1977, pages 1443 to 1458). This program is used in known manner, initially being supplied with the desired characteristic values and resistive termination impedances Z1 and Z2 to determine a transfer function of the filter, and from this and the desired configuration of the filter to derive the form of a filter which satisfies the characteristic values and which is matched to the resistive termination impedances Z1 and Z2. This typically results in the form of filter shown in FIG. 4, which is a 3rd order filter having series inductors 18, 19 and a shunt path including a capacitor 20 in series with an inductor 21. Using the characteristic values and terminating impedances specified above, the elements 18 to 21 have values of 50.41 mH, 50.41 mH, 95.79 nF, and 0.497 mH respectively, as indicated in FIG. 4.

FIG. 5 is a complex impedance graph, for a frequency of 3000 Hz, illustrating the resistance R and reactance X of various points A to E. The point A, of zero reactance and 600 ohm resistance, corresponds to the nominal termination impedances Z1 and Z2 for which the filter of FIG. 4 is designed as described above. However, the subscriber line 12 is in practice not a purely resistive and accurately known impedance but a capacitive impedance which typically falls anywhere within the shaded area of FIG. 5, bounded by the points B, C, D, and E.

Figure 4:
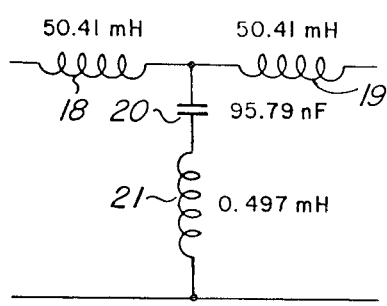
FIG. 4 illustrates a low pass filter designed in accordance with the prior art.

FIG. 6 illustrates the attenuation of the filter of FIG. 4 in its passband up to 3000 Hz, relative to its attenuation at 1000 Hz, when the filter of FIG. 4 is terminated with impedances corresponding to each of the points A to E in FIG. 5. As shown by the curve A, when the filter is terminated by the 600 ohm resistance for which it is designed according to the prior art, the filter attenuation is fairly constant throughout the passband, the ripple being within the design limit of Ap=±0.1 dB. However, when the filter is terminated by the various impedances corresponding to the points B to E (100 ohms for point B, 2000 ohms for point C, 1288 ohms in parallel with 19.58 nF for point D, and 2500 ohms in parallel with 10.56 nF for point E), the filter attenuation in the passband changes as shown by the curves B to E respectively in FIG. 6, becoming much more variable so that the ripple greatly exceeds the design limit Ap.

Accordingly it can be seen that a filter such as that of FIG. 4, designed according to the prior art, can not be used with arbitrary subscriber lines 12 whose impedances fall anywhere within the shaded area of FIG. 5, if the design characteristics of the filter are to be satisfied. A result of this is that prior art filters must be individually designed for and/or matched to the subscriber lines with which they are to be used, in order to meet the required design characteristics. This individual design or matching is a great disadvantage because it is costly and time consuming and the filters are not readily interchangeable. Alternatively, much more complex and costly adaptive filters or buffered filters must be used.

In accordance with the invention, this disadvantage is very largely avoided or substantially eliminated by designing each of the low pass filters 15 and 16 in accordance with the desired characteristics already discussed, but with the additional constraint that the quantities $|Zin-Z2|$ and $|Zout-Z1|$ be substantially minimized in the pass band of the filter. As already explained, Z1 and Z2 are the nominal input and output, respectively, termination impedances of the filter as shown in FIG. 3 (which may in this case be complex impedances rather than purely resistive impedances as in the prior art), Zin is the input impedance of the filter at its input port, and Zout is the output impedance of the filter at its output port. In order to substantially minimize the quantities $|Zin-Z2|$ and $|Zout-Z1|$, conveniently their sum $|Zin-Z2|+|Zout-Z1|$ is minimized.

Thus in order to design a suitable form for each of the low pass filters 15, 16 in accordance with this invention, the desired characteristic values fs, As, fp, and Ap and the nominal termination impedances Z1 and Z2 are used in the computer design program FILSYN to determine the transfer function of the filter, and from this and the desired configuration of the filter to determine a form of filter as in the prior art. Typically the result is a 3rd order filter as already described. This determined form of filter is then optimized, preferably using the computer aided design program SCAMPER (see Telesis, Volume 7, Number 3, 1980, pages 2 to 9, published by Bell-Northern Research Ltd.), to provide the best possible filter response. In the optimization process, component values of the filter are modified and updated if the modifications improve the filter response. The program SCAMPER is used with the additional constraint imposed in this program that the sum $|Zin-Z2| + |Zout-Z1|$ be minimized in the filter pass band. The SCAMPER program indicates that this can not be achieved with the number of variables provided by the determined form of the 3rd order filter. Accordingly, the FILSYN program is used again with the desired characteristic values and the nominal termination impedances with the additional requirement (not necessary in the prior art) that the filter be a higher order filter, e.g. a 5th order filter. As an alternative, a more restrictive pass band ripple Ap could be imposed upon the filter design using the FILSYN program, with a similar result. The resulting determined form of 5th order filter is then optimized using the SCAMPER program, again with the additional constraint imposed that the sum $|Zin-Z2| + |Zout-Z1|$ be minimized in the pass band. The resulting 5th order filter is typically as shown in FIG. 7, comprising shunt capacitors 22, 23, series inductors 24, 25, and a shunt path including a capacitor 26 in series with an inductor 27. Using the characteristic values and nominal terminating impedances discussed above and as used to determine the filter of FIG. 4 according to the prior art, the elements 22 to 27 have values of 30.88 nF, 30.88 nF, 24.96 mH, 24.96 mH, 30.54 nF, and 0.399 mH respectively, as indicated in FIG. 7. As illustrated in FIG. 8, the filter of FIG. 7 may be modified by providing the series inductances equally in the two wires of the filter, thereby balancing the filter. Thus in FIG. 8 the series inductances are provided by four 12.48 mH inductors.

Referring again to FIG. 6, a solid line 28 illustrates the attenuation of the filter of FIG. 7 or 8, relative to its attenuation at a frequency of 1000 Hz, in the pass band up to 3000 Hz. Unlike the prior art filter of FIG. 4, this attenuation is substantially the same throughout the passband regardless of the complex impedance, within the quadrant of the complex impedance graph of FIG. 5, with which the filter is terminated. Thus the line 28 in FIG. 6 represents the filter attenuation in the passband for all of the points A to E in FIG. 5.

It can thus be seen that the filter of FIG. 7 or 8 can be used as each of the low pass filters 15 and 16 in FIG. 1 to provide the desired filter characteristics regardless of the nature of the particular subscriber line 12 which is used. Thus this relatively simple filter can be used interchangeably, without requiring expensive buffering or adjustment, on arbitrary subscriber lines 12, the desired low pass filter characteristics always being satisfied.

In order to couple data between each of the modems 13 and 14 and the two-wire subscriber line 12, a coupling network is needed which does not adversely affect the designed filter characteristics, couples the data to and from the line 12 in a balanced manner, and avoids data signals being attenuated by the filter components. In the latter respect in particular the shunt capacitor 22 or 23 of the filter provides a low impedance across the line 12 for above voice-band data signals. FIG. 9 illustrates a modified form of the low pass filter of FIG. 8 and also illustrates the form of a coupling network which meets these requirements. This arrangement is described in greater detail in, and forms the subject of, the application by R.T. Carsten et al. already referred to and incorporated herein by reference.

The arrangement shown in FIG. 9 serves to couple frequency-shift-keyed (FSK) data at a center frequency of 36 kHz from the modem 14 at the central office end of the line 12 to the line for transmission to the subscriber end modem 13, and serves to couple FSK data at a center frequency of 22 kHz received from the modem 13 via the line 12 to the modem 14. Thus this arrangement enables the transmission of full duplex FSK data simultaneously with voice-frequency signals via the line 12.

Referring to FIG. 9, the low pass filter comprising the components 22 to 27 is the same as described above with reference to FIGS. 7 and 8, except for the arrangement of the inductors 24 and 25 and the connections of the shunt capacitor 22 on the line 12 side of the filter. The components of the filter have the same reactances as described above to provide the same filter characteristics. As in the filter of FIG. 8, in FIG. 9 each of the inductors 24 and 25 is divided equally between the two wires of the filter. Furthermore, in the filter of FIG. 9 the divided inductances of each inductor 24 and 25 are coupled with phases as indicated by dots in FIG. 9, to provide improved longitudinal balance and to reduce their physical size. The coupled coils of each inductor 24 and 25 are bifilar wound, the inductance of each individual coil, measured with the coil to which it is coupled open-circuit, being 6.24 mH to provide the desired total inductance of 24.96 mH for each inductor.

The capacitor 22, instead of being connected directly between the wires of the line 12 as in the filter of FIGS. 7 and 8, is connected between these wires via two secondary windings 28a, 28b of a transformer 28 also having a primary winding 28c. The windings are phased as shown by dots in FIG. 9, to couple between unbalanced signals on a line 29 and balanced signals on the line 12. The transformer 28 has a turns ratio from the primary to the secondaries of 2.11 to 1. The primary winding 28c is coupled to the line 29 via a resistor 30, which together with series-connected oppositely-poled zener diodes 31 coupled between the line 29 and circuit ground provide lightning protection for the circuitry coupled to the line 29.

FSK data from the modem 14 at the 22 kHz center frequency is conducted from a wire 32 to the line 29 via a 22 kHz passive bandpass filter and amplifier 33, a parallel resonant circuit comprising an inductor 34 and a capacitor 35, and a series resistor 36. This data is coupled from the line 29 to the line 12 via the resistor 30 and the transformer 28. In the opposite transmission direction, FSK data received via the line 12 at the 36 kHz center frequency is coupled to the line 29 via the transformer 28 and the resistor 30. This data is coupled from the line 29 to a wire 37, leading to the modem 14, via a series resistor 38, a shunt resistor 39, and a 36 kHz passive bandpass filter 40. A parallel resonant circuit comprising an inductor 41 and a capacitor 42 is also connected between the line 29 and circuit ground. The magnitudes of the various components 34, 35, 36, 38, 39, 41, and 42 are shown in FIG. 9.

The inductor 34 and the capacitor 35 are parallel resonant at 36 kHz, so that they inhibit any 36 kHz component of the 22 kHz transmit data signals reaching the line 29 and thence being coupled to the wire 37. The inductor 41 and the capacitor 42 are parallel resonant at 22 kHz, so that they are an effective open circuit at this frequency and do not shunt the transmit data signals to ground. The inductor 34, and the capacitor 22 of the low pass filter, as reflected through the transformer 28, are series resonant at 22 kHz. Consequently the transmit data signals at this frequency are coupled from the wire 32 to the line 12 without significant attenuation by the low pass filter. The series resistor 36 reduces impulse noise effects on the output of the filter and amplifier 33.

Receive data signals on the line 12 at a frequency of 36 kHz are coupled via the transformer 28 to the line 29, and thence via the filter 40 to the wire 37. Although these signals are attenuated by the parallel resonant circuit comprising the inductor 41 and the capacitor 42, and by the voltage divider formed by the resistors 38 and 39 which serve to properly terminate the filter 40 and avoid unduly loading the line 12, this attenuation can be compensated for by subsequent amplification of the signals. The attenuation of the receive data signals by the parallel resonant circuit 41, 42 could be reduced by providing a more complicated circuit which is parallel resonant at 36 kHz as well as at 22 kHz.

At voice frequencies, which the low pass filter is designed to pass to the central office 11, the parallel resonant circuit 41, 42 is effectively a short circuit to ground. Thus the primary winding 28c of the transformer 28 is virtually short-circuited via the resistor 30, and this virtual short circuit is reflected through the transformer to the secondary windings 28a and 28b, which consequently effectively couple the capacitor 22 directly to the wires of the line 12 as in FIGS. 7 and 8. The data coupling network, therefore, does not detract from the performance of the low pass filter in its pass-band.

The data coupling network at the subscriber end of the line 12 can be similar to that described above and shown in FIG. 9, except that it serves to receive FSK data at 22 kHz and to transmit FSK data at 36 kHz. Accordingly, this network can include a 2.81 mH series inductor in the transmit data signal path to series resonate with the relevant 30.88 nF filter capacitor at 36 kHz, this inductor corresponding to the inductor 34 in FIG. 9. The higher transmit frequency and the lower receive frequency in this case precludes using simply a parallel capacitor, corresponding to the capacitor 35 in FIG. 9, to trap transmit data signal components at the receive frequency, but these can be separately filtered, for example using an active transmit filter. The parallel resonant circuit, corresponding to the circuit 41, 42 in FIG. 9, can be constituted by a 4.6 mH inductor in parallel with a 4.12 nF capacitor to resonate at the transmit frequency of 36 kHz.

Although the invention has been described in its application to a low pass filter for connection to a telephone subscriber line, it is not limited in its application thereto, nor is it limited to the types of filter to which it may be applied. Thus the principles of the invention can be applied to other than low pass filters, e.g. to high pass and band pass filters, for connection to telephone subscriber lines, and can be applied to the design of low pass or other filters for use in other applications where variable or unknown termination impedances may be present.

For example, if in the arrangement of FIG. 1 it were desired to prevent voice frequency signals on the telephone subscriber line 12 from reaching the modems 13 and 14, then a high pass filter could be provided between each modem and the line 12, each high pass filter being designed in accordance with the invention to have the sum $|Zin-Z2|+|Zout-Z1|$ minimized in the pass band as described for the low pass filter above.

Furthermore, in other applications the form and order of the filter may vary from those described above, and in any event the particular impedances of the reactive components of the filter will be dependent upon the particular filter characteristics which are desired. Although the filter design described above uses the computer programs FILSYN and SCAMPER to determine the impedances of the reactive components of the filter, this being the preferred manner of effecting the filter design, the invention is not limited in this respect and other computer or manual design techniques may be used instead. Accordingly, the invention is not limited to the preferred embodiments described above, and numerous changes may be made without departing from the scope of the invention, which is defined in the claims.

What is claimed is:

1. A filter comprising reactive components which define a pass band and a stop band of the filter, said filter having an input port of input impedance Zin for termination with a source impedance Z1, and having an output port of output impedance Zout for termination with a load impedance Z2, wherein the impedances of said reactive components are selected to minimize the quantities $|Zin-Z2|$ and $|Zout-Z1|$ in said pass band.

2. A filter as claimed in claim 1 wherein the impedances of said reactive components are selected to minimize the sum $|Zin-Z2|+|Zout-Z1|$ in said pass band.

3. A filter as claimed in claim 2, wherein said filter is a low pass filter for connection to a telephone subscriber line for passing voice frequency signals on said subscriber line.

4. A filter as claimed in claim 3, wherein said filter is a 5th order filter.

5. A filter as claimed in claim 4 wherein, for nominal source and load impedances Z1 and Z2 of 600 ohms, said reactive components comprise in turn a shunt capacitance of about 30.88 nF, a series inductance of about 24.96 mH, a shunt capacitance of about 80.54 nF in series with an inductance of about 0.399 mH, a series inductance of about 24.96 mH, and a shunt capacitance of about 30.88 nF.

6. A filter as claimed in claim 5 wherein each of said series inductances is divided substantially equally between the two wires of the filter whereby the filter is substantially balanced.

7. In combination, a low pass filter having an input port and an output port, telephone equipment of nominal impedance Z1 coupled to the input port of the filter, and a telephone subscriber line of nominal impedance Z2 coupled to the output port of the filter, wherein the filter comprises reactive components which define a pass band for voice frequency signals and a stop band for higher frequencies, and wherein the impedances of said reactive components are selected to minimize the sum $|Zin-Z2|+|Zout-Z1|$ in said pass band, where Zin and Zout are respectively the input and output impedances of the filter, whereby the attenuation of the filter throughout said pass band is substantially constant regardless of the actual impedance of the telephone subscriber line.

8. A method of determining impedances of reactive components of a filter, having characteristics including a pass band with a predetermined maximum attenuation variation and a stop band with a predetermined minimum attenuation, for termination with a nominal source impedance Z1 and a nominal load impedance Z2, said method comprising determining said impedances to provide said characteristics and to minimize the quantities |Zin-Z2| and |Zout-Z1| in said pass band, where Zin and Zout are respectively the input and output impedances of the filter.

9. A method as claimed in claim 8 wherein said filter is a low pass filter, having a pass band for voice frequency signals, for connection to a telephone subscriber line.

* * * * *